(12) United States Patent
Miyazawa et al.

(10) Patent No.: US 10,489,618 B2
(45) Date of Patent: Nov. 26, 2019

(54) CARD READER

(71) Applicant: NIDEC SANKYO CORPORATION, Suwa-gun Nagano (JP)

(72) Inventors: Shinya Miyazawa, Suwa-gun Nagano (JP); Masaya Fujimoto, Suwa-gun Nagano (JP); Junro Takeuchi, Suwa-gun Nagano (JP)

(73) Assignee: NIDEC SANKYO CORPORATION, Suwa-Gun, Nagano (JP)

( * ) Notice: Subject to any disclaimer, the term of this patent is extended or adjusted under 35 U.S.C. 154(b) by 56 days.

(21) Appl. No.: 15/940,047

(22) Filed: Mar. 29, 2018

(65) Prior Publication Data
US 2018/0285604 A1   Oct. 4, 2018

(30) Foreign Application Priority Data

Mar. 30, 2017  (JP) .................................. 2017-067134
Mar. 30, 2017  (JP) .................................. 2017-067136

(51) Int. Cl.
| | | |
|---|---|---|
| G06K 7/08 | (2006.01) | |
| H05K 1/14 | (2006.01) | |
| H05K 1/02 | (2006.01) | |

(52) U.S. Cl.
CPC ........... *G06K 7/087* (2013.01); *H05K 1/0254* (2013.01); *H05K 1/0275* (2013.01); *H05K 1/147* (2013.01); *H05K 1/028* (2013.01); *H05K 2201/052* (2013.01); *H05K 2201/09027* (2013.01); *H05K 2201/09036* (2013.01); *H05K 2201/09227* (2013.01); *H05K 2201/10151* (2013.01)

(58) Field of Classification Search
CPC ............................. G06K 7/087; H05K 1/0254
USPC ......................................... 235/449, 451, 435
See application file for complete search history.

(56) References Cited

U.S. PATENT DOCUMENTS

| | | | | |
|---|---|---|---|---|
| 9,578,763 | B1* | 2/2017 | Wade | .................. H05K 5/0208 |
| 10,127,409 | B1* | 11/2018 | Wade | ..................... G06Q 20/30 |
| 10,201,078 | B2* | 2/2019 | Fujimoto | ............. G06K 7/0021 |
| 2005/0182961 | A1* | 8/2005 | Timmermans | .......... G06F 21/86 |
| | | | | 726/26 |
| 2015/0340124 | A1* | 11/2015 | Gomi | ...................... H01B 5/04 |
| | | | | 235/439 |

(Continued)

FOREIGN PATENT DOCUMENTS

JP         2012203950 A     10/2012

*Primary Examiner* — Allyson N Trail
(74) *Attorney, Agent, or Firm* — Cantor Colburn LLP

(57) ABSTRACT

A card reader may include a main body frame; a flexible printed circuit board; and a protection board to protect a part of the flexible printed circuit board. The flexible printed circuit board may include a data signal circuit layer having a data signal circuit for transferring data, and a destruction detection circuit layer having a destruction detection circuit. The destruction detection circuit layer may overlap the data signal circuit layer. A second destruction detection circuit may be provided on the protection board. The destruction detection circuit layer is provided on one side of the data signal circuit layer. Part of the flexible printed circuit board may be covered with the protection board. The data signal circuit layer may be arranged on the main body frame side at least in the unprotected area and the destruction detection circuit layer may be arranged on an outer side of the card reader.

5 Claims, 8 Drawing Sheets

(56) References Cited

U.S. PATENT DOCUMENTS

2016/0154981 A1* 6/2016 Wesselhoff ............ G06F 21/87
                                                                      726/34

* cited by examiner

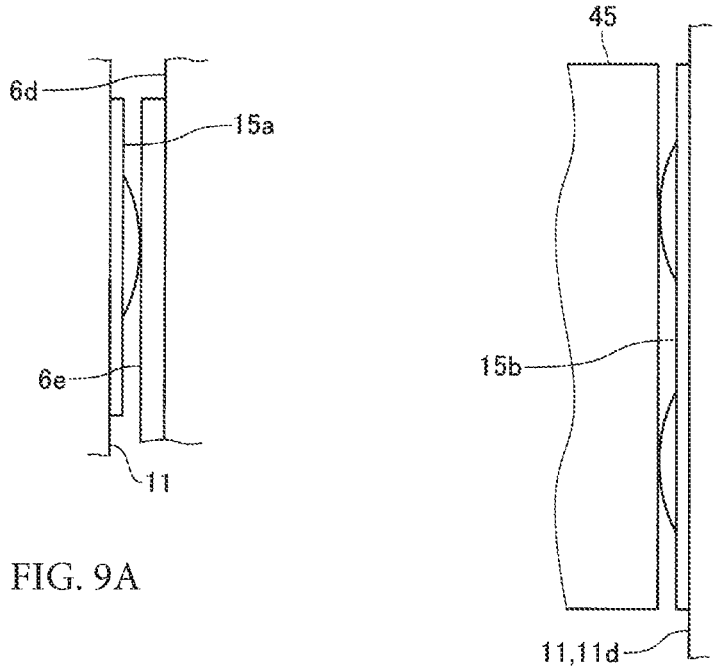
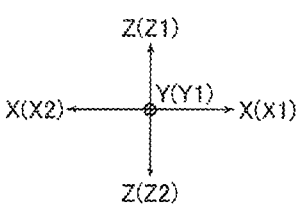
FIG. 9A
FIG. 9B

CARD READER

CROSS REFERENCE TO RELATED APPLICATION

The present application claims priority under 35 U.S.C. § 119 to Japanese Applications No. 2017-067134 filed Mar. 30, 2017; and No. 2017-067136, filed Mar. 30, 2017; the entire contents of which are incorporated herein by reference.

BACKGROUND

Field of the Invention

At least an embodiment of the present invention relates to a card reader that reads data recorded on a card and records data on a card.

Description of Related Documents

A manual card reader that reads data recorded on a card and records data on a card has been proposed (for example, see Japanese Unexamined Patent Application Publication No. 2012-203950). The card reader described in Japanese Unexamined Patent Application Publication No. 2012-203950 includes a magnetic head that reads magnetic data recorded on a card and a flexible printed circuit connected to the magnetic head.

In the card reader described in Japanese Unexamined Patent Application Publication No. 2012-203950, the flexible printed circuit board has a multilayer structure including a data signal layer, a disconnection detection signal layer, and an insulation layer. The insulation layer, the disconnection detection signal layer, the insulation layer, the data signal layer, the insulation layer, the disconnection detection signal layer, and the insulation layer are stacked in this order from the front side to the back side of the flexible printed circuit board. A data signal circuit (a data signal pattern) for transferring signals of the magnetic data is formed on the data signal layer. A disconnection detection signal circuit (a disconnection detection signal pattern) for detecting its own disconnection is formed on the disconnection detection signal layer.

In the card reader described in Japanese Unexamined Patent Application Publication No. 2012-203950, the data signal circuit is covered with the disconnection detection signal circuit from both the front and rear sides of the flexible printed circuit board. Therefore, in this related-art card reader, if a malicious user attaches a signal line to the data signal circuit in order to maliciously acquire data from the data signal circuit, the disconnection detection signal circuit is disconnected and it is detected that a malicious act is being performed on the flexible printed circuit board. Also, when it is detected that a malicious act is being performed on the flexible printed circuit board, malicious data acquisition from the data signal circuit can be avoided by performing predetermined processes.

SUMMARY

In the card reader described in Japanese Unexamined Patent Application Publication No. 2012-203950, the data signal circuit is covered with the disconnection detection signal circuit from both the front and rear sides of the flexible printed circuit board. Therefore, as described above, malicious data acquisition from the data signal circuit can be avoided. In this related-art card reader, the disconnection detection signal layer is arranged on both sides of the data signal layer in the thickness direction of the flexible printed circuit board. As a result, a cost and a thickness of the flexible printed circuit board increase. Also, as a thickness of the flexible printed circuit board increases, flexibility of the flexible printed circuit board decreases, and as a result, followability of the magnetic head to the card may be lowered.

At least an embodiment of the present invention provides a card reader that includes a flexible printed circuit board on which a data signal circuit for transferring signals of data read from a card and signals of data recorded on a card is formed, in which a cost and a thickness of the flexible printed circuit board can be reduced and, at the same time, malicious data acquisition from the data signal circuit can be avoided.

To address the issues above, the card reader according to at least an embodiment of the present invention is a card reader that performs at least one of reading data recorded on a card and recording data on a card, which includes a main body frame in which a card moving path along which the card moves is formed, a flexible printed circuit board pulled around along the main body frame, and a protection board that is a printed circuit board configured to protect a part of the flexible printed circuit board. The flexible printed circuit board includes a data signal circuit layer on which a data signal circuit for transferring at least one of signals of data read from the card and signals of data recorded on the card is formed, and a destruction detection circuit layer on which a destruction detection circuit for detecting at least one of its own disconnection and short-circuit is formed, and the destruction detection circuit layer overlaps the data signal circuit layer. A second destruction detection circuit for detecting at least one of its own disconnection and short-circuit is formed on the protection board. The destruction detection circuit layer is formed on one side of the data signal circuit layer in the thickness direction of the flexible printed circuit board. A part of the flexible printed circuit board is covered with the protection board. When an area of the flexible printed circuit board covered with the protection board is a protected area and an area other than the protected area is an unprotected area, the flexible printed circuit board is pulled around so that the data signal circuit layer is arranged on the main body frame side at least in the unprotected area and the destruction detection circuit layer is arranged on the outer side of the card reader.

In the card reader of at least an embodiment of the present invention, the destruction detection circuit layer is formed on one side of the data signal circuit layer in the thickness direction of the flexible printed circuit board. Therefore, in at least an embodiment of the present invention, compared to when the destruction detection circuit layer is formed on both sides of the data signal circuit layer in the thickness direction of the flexible printed circuit board, the cost and the thickness of the flexible printed circuit board can be reduced at the same time.

In at least an embodiment of the present invention, a part of the flexible printed circuit board is covered with the protection board in the protected area. Therefore, if a malicious user tries to attach a signal line to the data signal circuit in order to maliciously acquire data in the protected area, at least the second destruction detection circuit of the protection board may be disconnected or short-circuited, whereby it can be detected that a malicious act is being performed on the flexible printed circuit board.

Also, in at least an embodiment of the present invention, the remaining part of the flexible printed circuit board is not covered with the protection board in the unprotected area which is an area other than the protected area, but the flexible printed circuit board is pulled around so that the data signal circuit layer is arranged on the main body frame side, and the destruction detection circuit layer is arranged on the outer side of the card reader. Therefore, in at least an embodiment of the present invention, if a malicious user tries to attach a signal line to the data signal circuit in the unprotected area in order to maliciously acquire data, the destruction detection circuit of the flexible printed circuit board may be disconnected or short-circuited, whereby it can be detected that a malicious act is performed on the flexible printed circuit board.

That is, in at least an embodiment of the present invention, in both the protected area and the unprotected area, if a malicious user tries to attach a signal line to the data signal circuit in order to maliciously acquire data, it can be detected that a malicious act is being performed on the flexible printed circuit board. In at least an embodiment of the present invention, when it is detected that a malicious act is being performed on the flexible printed circuit board, malicious data acquisition from the data signal circuit can be avoided by performing predetermined processes. As described above, in at least an embodiment of the present invention, while a cost and a thickness of the flexible printed circuit board can be reduced at the same time, malicious data acquisition from the data signal circuit can be avoided.

In at least an embodiment of the present invention, the card reader, for example, further includes a magnetic head that performs at least one of reading magnetic data recorded on the card and recording magnetic data on the card, and a control board which is a printed circuit board for control. When an insertion direction side of the card into the card reader is a rear side and a removal direction side of the card from the card reader is a front side, the main body frame includes a card holding portion that holds a rear end portion of the card inserted into the card reader, and a head attaching portion arranged on the front side of the card holding portion and in which the magnetic head is arranged, one end of the flexible printed circuit board is connected to the magnetic head, and the other end of the flexible printed circuit board is connected to the control board, the magnetic head is arranged in the unprotected area, and the control board is fixed to the card holding portion and is arranged in the protected area.

According to at least an embodiment of the present invention, a thickness of the flexible printed circuit board can be reduced and, as a result, flexibility of the flexible printed circuit board can be increased. In this case, followability of the magnetic head to the card can be provided even if one end of the flexible printed circuit board is connected to the magnetic head. In at least an embodiment of the present invention, the data signal circuit layer is arranged on the main body frame side and the destruction detection circuit layer is arranged on the outer side of the card reader in the unprotected area. In this case, malicious acquisition of magnetic data from the data signal circuit can be avoided even if the magnetic head is arranged in the unprotected area.

In at least an embodiment of the present invention, for example, the main body frame includes a flange portion extending in a flange shape from a front end of the card holding portion, the head attaching portion protrudes to the front from the flange portion, the protected area is located on the rear side of the flange portion, the data signal circuit layer is arranged on the main body frame side at least on the front side of the flange portion, and the destruction detection circuit layer is arranged on the outer side of the card reader.

In at least an embodiment of the present invention, when one side in the thickness direction of the card moving along the card moving path is a first direction side, a side opposite to the first direction side is a second direction side, one side in the width direction of the card orthogonally crossing the thickness direction and the front-rear direction of the card is a third direction side, and a side opposite to the third direction side is a fourth direction side, for example, the magnetic head is arranged so that a magnetic gap of the magnetic head faces the card moving path from the first direction side, the one end of the flexible printed circuit board is connected to the first direction end side of the magnetic head, the control board is fixed to the surface of the second direction side of the card holding portion, the flexible printed circuit board is formed in a long thin band shape having a first board portion extending to the rear side from the magnetic head along a surface of the first direction side of the head attaching portion and a surface of the first direction side of the card holding portion, a first bent portion bent 90 degrees on the third direction side at a rear end of the first board portion, a second board portion extending on the third direction side from the first bent portion, a second bent portion bent 90 degrees on the second direction side at the third direction end of the second board portion, a third board portion extending on the second direction side from the second bent portion, a third bent portion bent 90 degrees on the fourth direction side at the second direction edge of the third board portion, and a fourth board portion extending on the fourth direction side from the third bent portion and is connected to the control board, the first bent portion, the second board portion, the second bent portion, the third board portion, the third bent portion and the fourth board portion are arranged on the rear side of the flange portion, in the first board portion, the data signal circuit layer is arranged on the body frame side, and the destruction detection circuit layer is arranged on the outer side of the card reader, in the second board portion, the third board portion and the fourth board portion, the destruction detection circuit layer is arranged on the main body frame side, and the data signal circuit layer is arranged on the outer side of the card reader.

In this case, the flexible printed circuit board is formed in a long thin band shape. Therefore, in the second board portion, the third board portion, and the fourth board portion, the destruction detection circuit layer is arranged on the main body frame side and the data signal circuit layer is arranged on the outer side of the card reader, and the second board portion, the third board portion, and the fourth board portion are arranged in the protected area on the rear side of the flange portion. Therefore, even if the destruction detection circuit layer is arranged on the card holding portion side and the data signal circuit layer is arranged on the outer side of the card reader in the second board portion, the third board portion, and the fourth board portion, malicious acquisition of magnetic data from the data signal circuit can be avoided. That is, even if the flexible printed circuit board is formed in a long thin band shape in order to increase the number of flexible printed circuit boards to be fabricated, malicious acquisition of magnetic data from the data signal circuit can be avoided. Therefore, further reduction of the cost of the flexible printed circuit board and avoidance of malicious acquisition of magnetic data from the data signal circuit at the same time at possible.

In at least an embodiment of the present invention, for example, the protection board includes a first protection board, a second protection board, a third protection board, a fourth protection board, and a fifth protection board which are plate-shaped or film-shaped, the first protection board is arranged on the rear side of the card holding portion, the second protection board is arranged farther toward the first direction side than the first board portion and the second board portion, the third protection board is arranged farther toward the second direction side than the fourth board portion, the fourth protection board is arranged farther toward the third direction side than the third board portion, and the fifth protection board is arranged farther toward the fourth direction side than the card holding portion.

As described above, in at least an embodiment of the present invention, in a card reader that includes a flexible printed circuit board on which a data signal circuit for transmitting signals of data read from a card and signals of data recorded on a card is formed, while a cost and a thickness of the flexible printed circuit board can be reduced at the same time, malicious data acquisition from the data signal circuit can be prevented.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which:

FIG. 9A is a diagram illustrating a configuration of a detection mechanism illustrated in FIG. 8, and FIG. 9B is a diagram illustrating a configuration of a second detection mechanism illustrated in FIG. 8.

DETAILED DESCRIPTION

Figure 1:
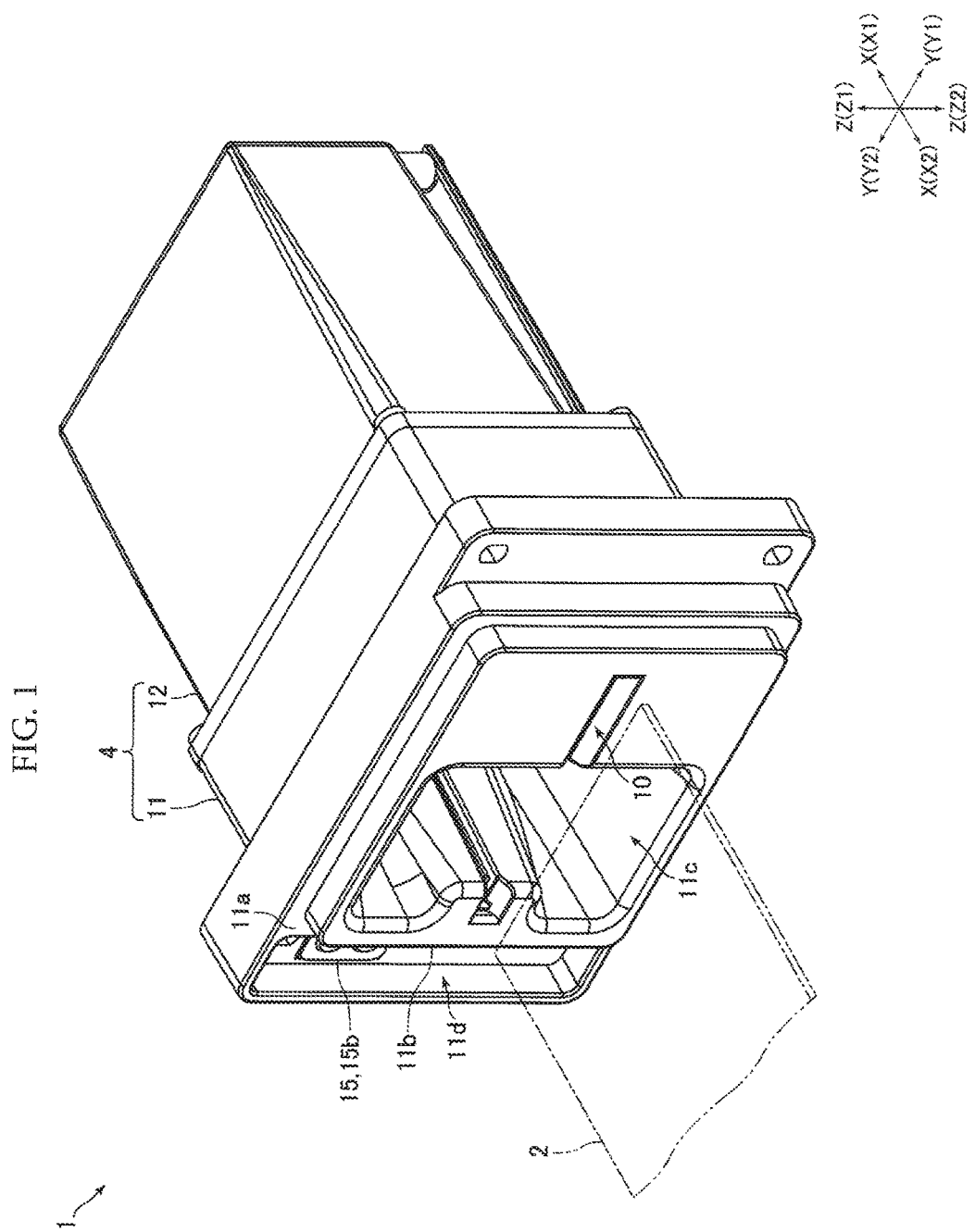
FIG. 1 is a perspective view of a card reader according to an embodiment of the present invention.
Figure 2:
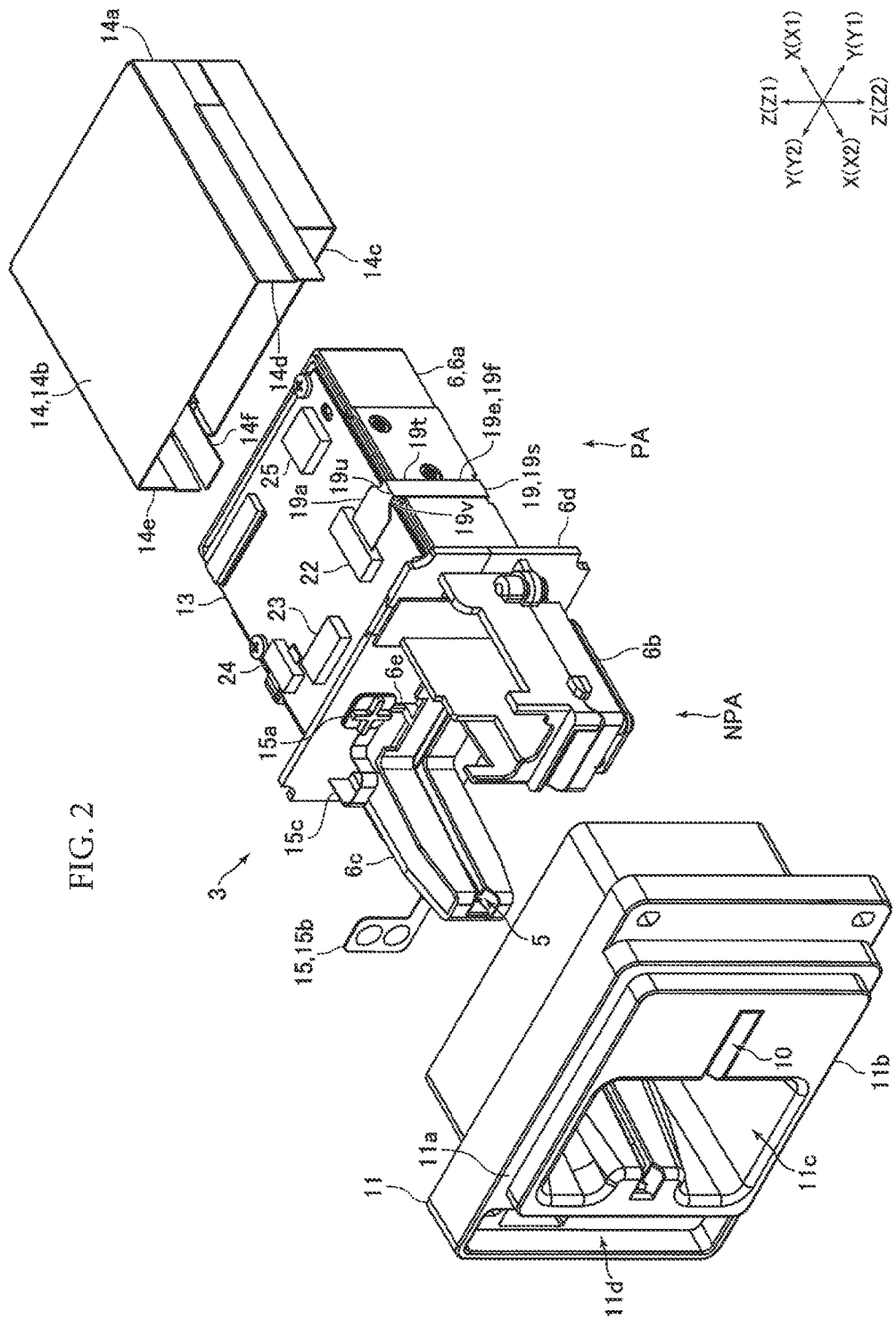
FIG. 2 is an exploded perspective view of the card reader illustrated in FIG. 1 a case main body removed therefrom.
Figure 3:
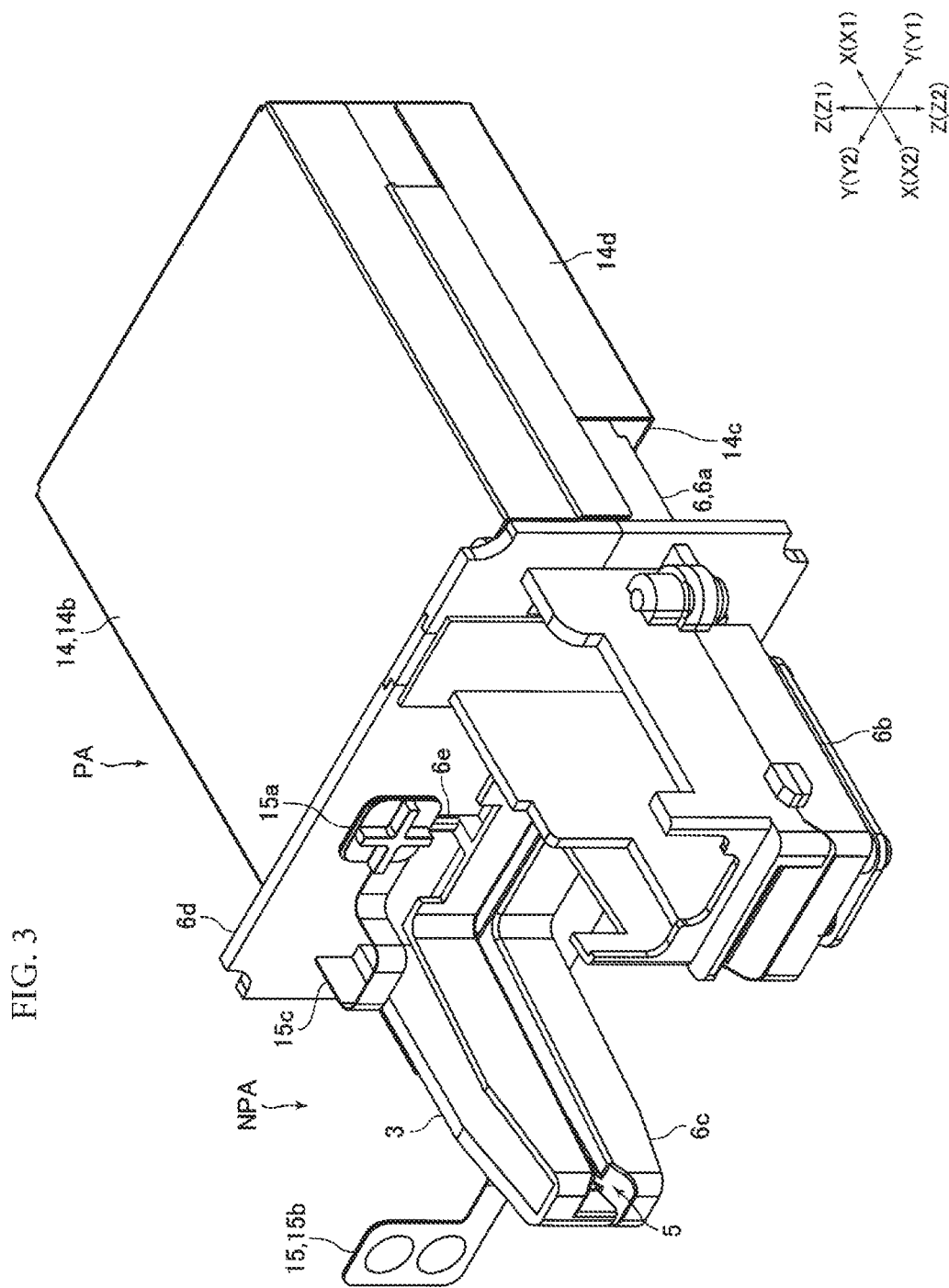
FIG. 3 is a perspective view of the card reader illustrated in FIG. 1 the case body removed therefrom.
Figure 4:
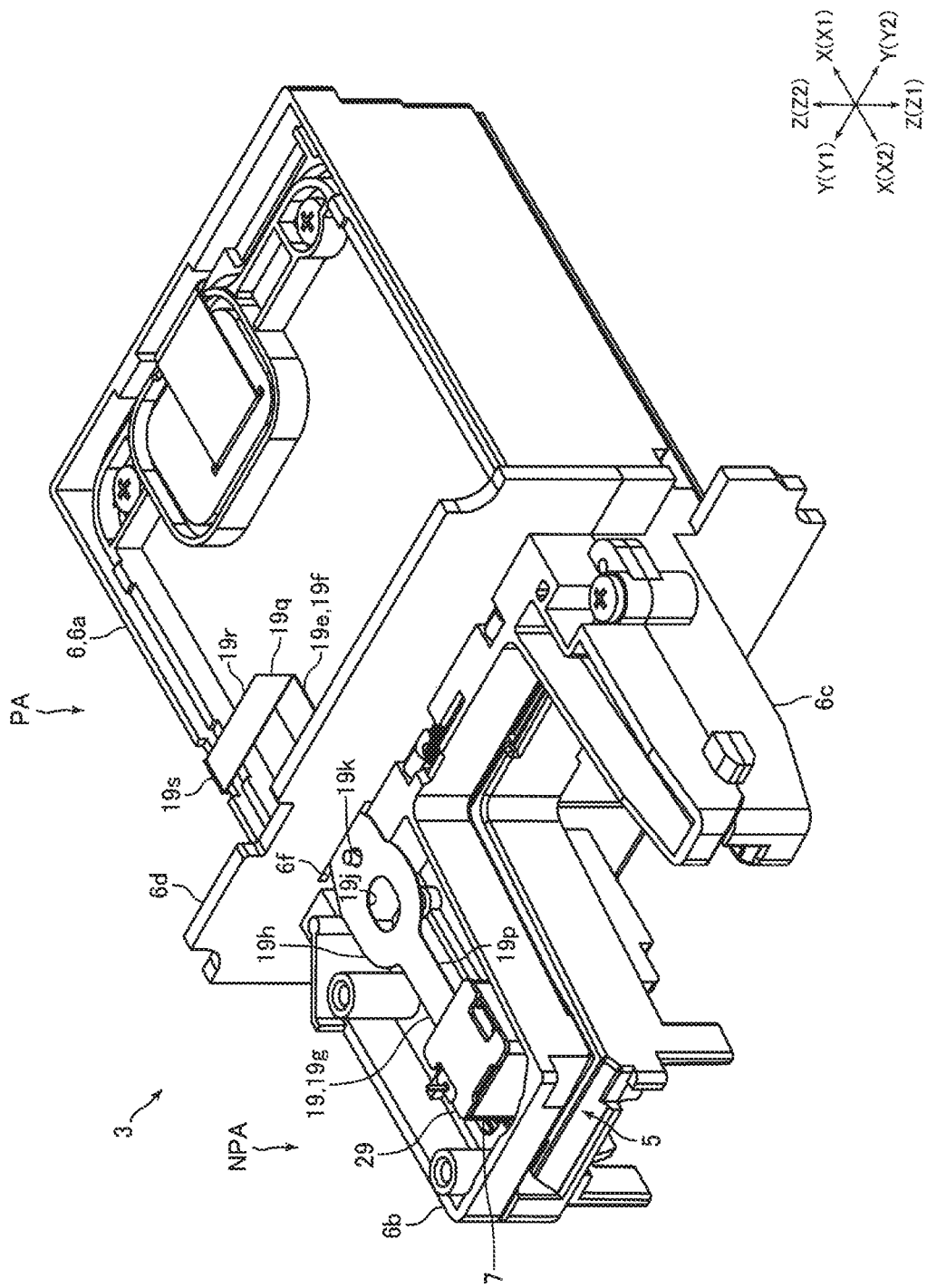
FIG. 4 is a perspective view of the card reader illustrated in FIG. 1 seen from another direction, the case body, a protection board, and the like removed therefrom.

Below, embodiments of the present invention will be described with reference to the drawings.
Entire Configuration of Card Reader FIG. 1 is a perspective view of a card reader 1 according to an embodiment of the present invention. FIG. 2 is an exploded perspective view of the card reader 1 illustrated in FIG. 1 a case main body 12 removed therefrom. FIG. 3 is a perspective view of the card reader 1 illustrated in FIG. 1 a case body 4 removed therefrom. FIG. 4 is a perspective view of the card reader 1 illustrated in FIG. 1 seen from another direction, the case body 4, the protection board 14, and the like removed therefrom.

The card reader 1 of the present embodiment is a device that reads data recorded on a card 2 or records data on the card 2. More specifically, the card reader 1 is a "dip type" card reader in which the card 2 is manually inserted into the card reader 1 and removed from the card reader 1 for reading and recording data. This card reader 1 is used after being installed in, for example, an upper-level device, such as a refueling device in an unmanned or self-service gas station, or an automatic teller machine (ATM).

The card 2 is, for example, a rectangular card made of vinyl chloride and has a thickness of approximately 0.7 to 0.8 mm. A magnetic stripe on which magnetic data is recorded is formed on one surface of the card 2. An IC chip is embedded in the card 2 and external connection terminals of the IC chip are formed on the other surface of the card 2. Note that the card 2 may be a card made of polyethylene terephthalate (PET) having a thickness of approximately 0.18 to 0.36 mm or a card made of paper having a predetermined thickness, and the like.

The card reader 1 includes a card reader main body 3 and a case body 4 that covers the card reader main body 3. The card reader main body 3 includes a main body frame 6 in which a card moving path 5 along which the card 2 moves is formed, a magnetic head 7 (see FIG. 4) that at least one of reads the magnetic data recorded on the card 2 and records the magnetic data on the card 2, and an IC contact block (not illustrated) including a plurality of IC contact springs for communicating data with the IC chip embedded in the card 2.

The case body 4 is formed by a front cover 11 and the case main body 12. The front cover 11 has an insertion opening 10 of the card 2 formed. The card reader 1 includes a control board 13 that is a printed circuit board for the control (see FIG. 2), a protection board 14 that is a printed circuit board for protecting the control board 13, and a sheet switch (a membrane switch) 15 for detecting that the front cover 11 has been removed and that the card reader 1 has been removed from an upper-level device.

In the present embodiment, the card 2 which is operated manually moves in an X direction illustrated in FIG. 1 and the like. That is, the X direction is a traveling direction of the card 2 moving along the card moving path 5. The card 2 is inserted in an X1 direction and is removed in an X2 direction. A Z direction in FIG. 1 and the like orthogonally crossing the X direction is a thickness direction of the card 2 moving along the card moving path 5, and a Y direction in FIG. 1 and the like orthogonally crossing the X direction and the Z direction is a width direction (a transverse direction) of the card 2 moving along the card moving path 5.

In the description below, the X direction is the front-rear direction, the Y direction is the left-right direction, and the Z direction is the up-down direction. The X1 direction side that is the insertion direction of the card 2 into the card reader 1 is the "rear (back)" side, and the X2 direction side that is a removal direction of the card 2 from the card reader 1 is the "front" side. A Y1 direction side that is one side in the left-right direction is the "right" side, a Y2 direction side that is the opposite side in the left-right direction is the "left" side, a Z1 direction side that is one side in the up-down direction is the "upper" side, and a Z2 direction side that is the opposite side in the up-down direction is the "lower" side. The lower side of the present embodiment (the Z2 direction side) is the first direction side that is one side in the thickness direction of the card 2, and the upper side (the Z1 direction side) is the second direction side. The right side (the Y1 direction side) is the third direction side that is one side in the width direction of the card 2, and the left side (the Y2 direction side) is the fourth direction side.

The main body frame 6 includes a card holding portion 6a that holds a rear end portion of the card 2 inserted into the card reader 1 (that is, the card 2 inserted through the insertion opening 10), a head attaching portion 6b to which the magnetic head 7 is attached, and a card guide portion 6c that guides the card 2 inserted through the insertion opening 10. The head attaching portion 6b and the card guide portion 6c are arranged on the front side of the card holding portion 6a. A flange portion 6d extending in a flange shape is formed between the head attaching portion 6b and the card guide portion 6c, and the card holding portion 6a.

The flange portion 6d is formed in a substantially rectangular frame shape extending in the up-down and left-right directions from the front end of the card holding portion 6a. The head attaching portion 6b and card guide portion 6c protrude from the flange portion 6d to the front side. The head attaching portion 6b and the card guide portion 6c are formed a predetermined distance apart in the left-right direction. In the present embodiment, the head attaching portion 6b is arranged on the right side, and the card guide portion 6c is arranged on the light side. The magnetic head 7 is attached to a front-end side of the head attaching portion 6b. The magnetic head 7 is arranged such that a magnetic gap of the magnetic head 7 faces the card moving path 5 from below. The IC contact block is attached to the card holding portion 6a.

The front cover 11 is arranged on the front side of the main body frame 6 and covers a front side of the main body frame 6. The front cover 11 forms the front side of the card reader 1. An attachment surface 11a of the card reader 1 with respect to an upper-level device is formed on the front side of the front cover 11. The attachment surface 11a is a flat surface that orthogonally crosses the front-rear direction. On the front side of the front cover 11, an exposed portion 11b disposed inside the opening formed on the front panel of the upper-level device is formed. The exposed portion 11b is formed to protrude to the front side from the attachment surface 11a and, when the card reader 1 is attached to an upper-level device, forms a part of a front panel of the upper-level device. That is, the exposed portion 11b is exposed outside the upper-level device when the card reader 1 is attached to an upper-level device.

In the front cover 11, a finger insertion portion 11c is formed recessed toward the rear side from the front side of the exposed portion 11b. The finger insertion portion 11c has a size such that a user can insert a finger. When the user inserts the card 2 into the card reader 1, and when the user removes the card 2 from the card reader 1, the user inserts the finger into the finger insertion portion 11c. The insertion opening 10 is formed on a front side of the exposed portion 11b, and left and right sides and a rear side of the finger insertion portion 11c. On the front side of the front cover 11, a recessed portion 11d is formed recessed toward the rear side from the attachment surface 11a. The recessed portion 11d is formed on a left side of the exposed portion 11b.

The case main body 12 is formed in a substantially rectangular parallelepiped box-shape opened at the front end. The front cover 11 and the case main body 12 are fixed to each other a rear end of the front cover 11 and a front end of the case main body 12 being in contact with each other. The case body 4 covers upper and lower sides, left and right sides, and front and rear sides of the card reader main body 3.

Configurations of Control Board and Sheet Switch The control board 13 is a rigid board formed in a substantially rectangular flat plate shape. The control board 13 is fixed to the card holding portion 6a. More specifically, the control board 13 is fixed to the main body frame 6, that is, to an upper surface of the card holding portion 6a. The control board 13 is disposed in a manner such that the thickness direction of the control board 13 matches the up-down direction. Also, the control board 13 is arranged on the rear side of the flange portion 6d and below the upper end of the flange portion 6d. The magnetic head 7 is electrically connected to the control board 13 via a flexible printed circuit board 19 (hereinafter, "FPC 19"). Also, the IC contact block is electrically connected to the control board 13 via the flexible printed circuit board.

As illustrated in FIG. 2, a connector 22 to which the FPC 19 is connected, a connector 23 to which the protection board 14 is connected, and a connector 24 to which the sheet switch 15 is connected are mounted on the control board 13. The connectors 22 to 24 are mounted on the upper surface of the control board 13. Also, a battery 25 that supplies electric power to the sheet switch 15 is mounted on the control board.

The control board 13 includes a data signal circuit layer in which a data signal circuit that transfers signals of the magnetic data (data signals) read from the magnetic stripe of the card 2 by the magnetic head 7 and signals of data to record on the magnetic stripe of the card 2 by the magnetic head 7 is formed. Also, the control board 13 includes a data signal circuit layer in which a data signal circuit that transfers signals of data (data signals) read from the IC chip of the card 2 by an IC contact spring and signals of data to record on the IC chip of the card 2 by the IC contact spring is formed.

Figure 5A:
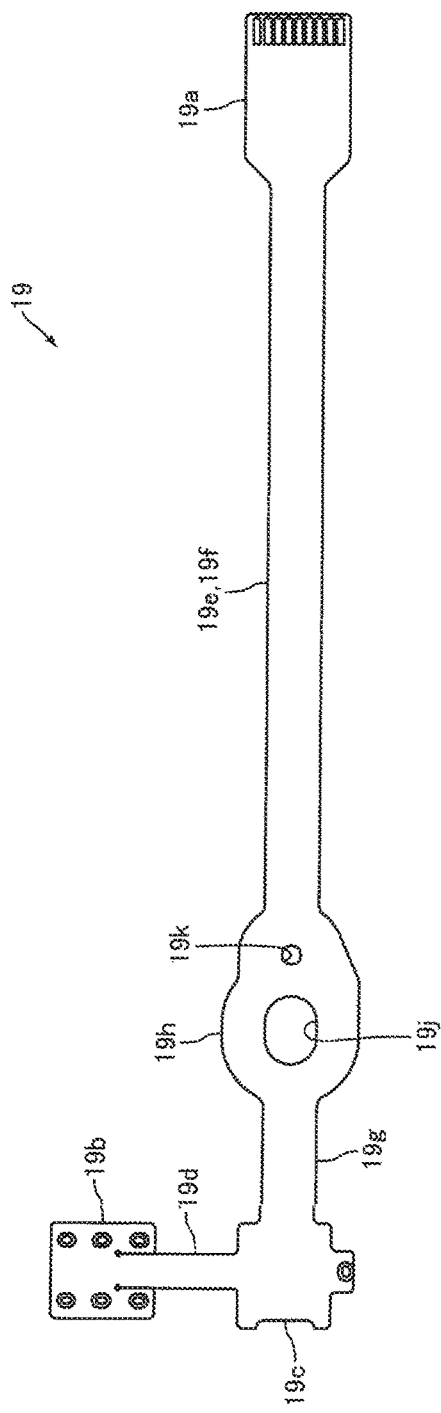
FIG. 5A is a developed view of the flexible printed circuit illustrated in FIG. 4
Figure 5B:
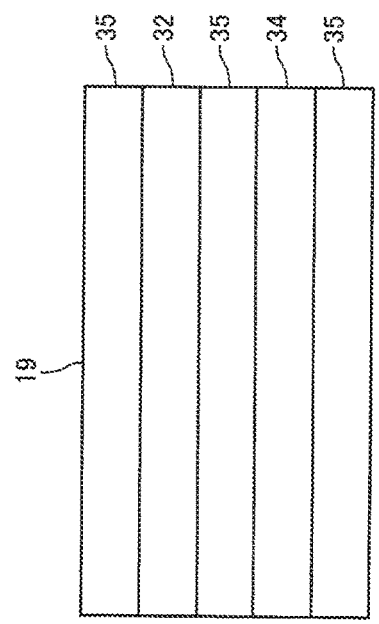
FIG. 5B is a cross-sectional view illustrating a configuration of the flexible printed circuit illustrated in FIG. 4.
Figure 6:
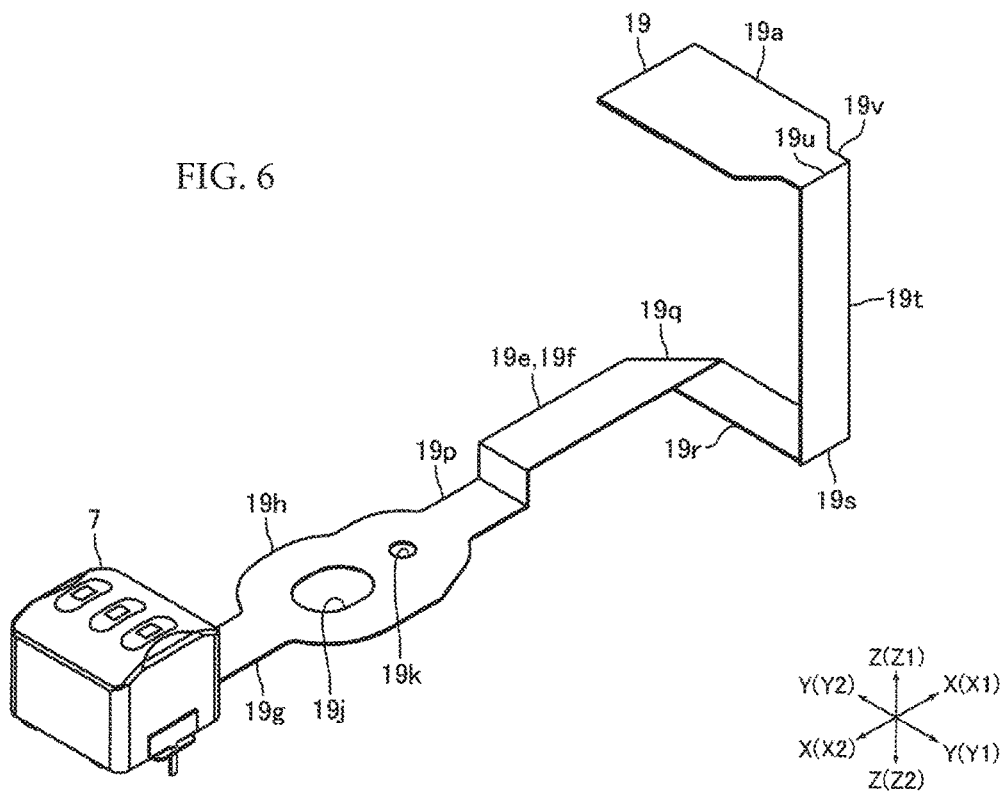
FIG. 6 is a perspective view of a magnetic head and the flexible printed circuit illustrated in FIG. 4 seen from another direction.

The sheet switch 15 is formed in a thin sheet shape. The sheet switch 15 includes a switch portion 15a for detecting that the front cover 11 is removed, a switch portion 15b for detecting that the card reader 1 is removed from an upper-level device, and a band-shaped connecting portion 15c that connects the switch portions 15a and 15b to the control board 13. The switch portions 15a and 15b are contact-type detection switches including contact electrodes, and the like. Configuration of Flexible Printed Circuit Board FIG. 5A is a developed view of the FPC 19 illustrated in FIG. 4, and FIG. 5B is a cross-sectional view illustrating a configuration of the FPC 19 illustrated in FIG. 4. FIG. 6 is a perspective view of the magnetic head 7 and the FPC 19 illustrated in FIG. 4 seen from another direction.

The FPC 19 is formed in a long thin band shape. One end of the FPC 19 is connected to the magnetic head 7. More specifically, one end of the FPC 19 is connected to a lower end side of the magnetic head 7. The other end of the FPC 19 is connected to the connector 22. That is, the other end of the FPC 19 is connected to the control board 13 via the connector 22. The FPC 19 is pulled around along the main body frame 6 in a state bent in a predetermined shape.

The FPC 19 includes a connected portion 19a connected to the connector 22, a connected portion 19b connected to the magnetic head 7, a cover portion 19c that covers the connected portion 19b, a connecting portion 19d that connects the connected portion 19b and the cover portion 19c, and a connecting portion 19e that connects the connected portion 19a and the cover portion 19c. The connected portion 19a is formed in a substantially rectangular shape. The connected portion 19b and the cover portion 19c are formed in substantially square shapes. The connecting portion 19d is formed in a linear shape.

The connecting portion 19e is formed by a linear-shaped first linear connecting portion 19f and a linear-shaped second linear connecting portion 19g, and a substantially oval-shaped oval connecting portion 19h arranged between the first linear connecting portion 19f and the second linear connecting portion 19g. One end of the first linear connecting portion 19f is connected to the connected portion 19a, and the other end of the first linear connecting portion 19f is connected to the oval connecting portion 19h. The one end of the second linear connecting portion 19g is connected to the cover portion 19c, and the other end of the second linear connecting portion 19g is connected to the oval connecting portion 19h.

The first linear connecting portion 19f and the second linear connecting portion 19g are formed to be arranged on the same line when the FPC 19 is developed. The connecting portion 19d is formed to orthogonally crosses the second linear connecting portion 19g when the FPC 19 is developed. Two through holes 19j and 19k are formed in the oval connecting portion 19h.

The connected portion 19b is soldered in a lower end portion of the magnetic head 7. The cover portion 19c covers the connected portion 19b from below. That is, the cover portion 19c covers, from below, an output terminal of the magnetic head 7 to which the connected portion 19b is connected. The connecting portion 19d is bent so that the connected portion 19b is covered by the cover portion 19c. The connected portion 19b, the connecting portion 19d and the cover portion 19c are covered by a sealing member (not illustrated). A cover 29 that covers the cover portion 19c from below is fixed to the lower end of the magnetic head 7 as illustrated in FIG. 4.

The connecting portion 19e is pulled around to the rear side from the magnetic head 7. The connecting portion 19e is pulled around along a surface of the main body frame 6 so that the connecting portion 19e formed in a thin film shape and a surface of the main body frame 6 are parallel to each other. In the present embodiment, the second linear connecting portion 19g and the oval connecting portion 19h are arranged on the front side of the flange portion 6d of the main body frame 6, and the first linear connecting portion 19f is arranged on the rear side of the flange portion 6d.

As illustrated in FIG. 4, the connecting portion 19e is pulled around to the rear side from the magnetic head 7 along the lower surface of the head attaching portion 6b and the lower surface of the card holding portion 6a, and then is bent 90 degrees to the right on the rear side of the flange portion 6d and is pulled around to the right side. Then, as illustrated in FIG. 2, the connecting portion 19e is bent 90 degrees to the upper side, pulled around along the right-side surface of the card holding portion 6a, then is bent 90 degrees to the left side, and is pulled around along an upper surface of the control board 13. A tip end of the portion of the connecting portion 19e bent to 90 degrees to the left is connected to the connected portion 19a. The connected portion 19a is inserted into the connector 22. That is, the connected portion 19a is connected to the control board 13. The connected portion 19a is arranged so that the connected portion 19a formed in a thin film shape and a surface of the control board 13 are parallel to each other.

As described above, the connecting portion 19e is formed by a board portion 19p, a bent portion 19q, a board portion 19r, a bent portion 19s, a board portion 19t, a bent portion 19u, and a board portion 19v. The board portion 19p as a first board portion extends to the rear side from the magnetic head 7 along the lower surface of the head attaching portion 6b and the lower surface of the card holding portion 6a. The bent portion 19q as a first bent portion is bent 90 degrees to the right side at the rear end of the board portion 19p. The board portion 19r as a second board portion extends to the right side from the bent portion 19q. The bent portion 19s as a second bent portion is bent 90 degrees upward at the right end of the board portion 19r. The board portion 19t as a third board portion extends upward from the bent portion 19s. The bent portion 19u as a third bent portion is bent 90 degrees to the left side at the upper end of the board portion 19t. The board portion 19v extends to the left side from the bent portion 19u. The left end of the bent portion 19u is connected to the right end of the connected portion 19a. In the present embodiment, a fourth board portion is formed by the board portion 19v and the connected portion 19a.

A front-end portion of the board portion 19p is formed by the second linear connecting portion 19g and the oval connecting portion 19h, and is arranged on the front side of the flange portion 6d. A rear end portion of the board portion 19p, the board portions 19r, 19t and 19v, the bent portions 19q, 19s and 19u, and the connected portion 19a are arranged on the rear side of the flange portion 6d. As described above, the board portion 19p is pulled around along the lower surface of the head attaching portion 6b and the lower surface of the card holding portion 6a. Also, the board portion 19r is pulled around along the lower surface of the card holding portion 6a, the board portion 19t is pulled around along the right-side surface of the card holding portion 6a, and the board portion 19v and the connected portion 19a are pulled around along the upper surface of the control board 13. The flange portion 6d includes a through hole 6f (see FIG. 4) that penetrates the flange portion 6d in the front-rear direction, and the connecting portion 19e is pulled around to pass through the through hole 6f.

The FPC 19 includes a data signal circuit layer 32, a destruction detection circuit layer 34, and an insulation layer 35. In the data signal circuit layer 32, a data signal circuit for transferring at least one of signals of data read from the card 2 and signals of data recorded on the card 2 is formed. In the destruction detection circuit layer 34, a destruction detection circuit for detecting its own disconnection and short-circuit is formed. The insulation layer 35 protects the data signal circuit layer 32 and the destruction detection circuit layer 34. An outer shape of the data signal circuit layer 32, an outer shape of the destruction detection circuit layer 34, and an outer shape of the insulation layer 35 are substantially the same as an outer shape of the FPC 19.

As illustrated in FIG. 5B, the insulation layer 35, the data signal circuit layer 32, the insulation layer 35, the destruction detection circuit layer 34 and the insulation layer 35 are stacked in this order from a first surface to a second surface of the FPC 19. That is, the destruction detection circuit layer 34 is stacked on the data signal circuit layer 32 via the insulation layer 35. The destruction detection circuit layer 34 is formed on one of the sides of the data signal circuit layer 32 in the thickness direction of the FPC 19.

The data signal circuit transfers signals of the magnetic data. This data signal circuit of the data signal circuit layer 32 is formed in substantially the entire area. Destruction detection signals flow in the destruction detection circuit. The destruction detection circuit is formed in a part of the connected portion 19a, a part of a cover portion 19c, and a part of the connecting portion 19e of the destruction detection circuit layer 34. Also, the destruction detection circuit is connected to the battery 25.

In the board portion 19p, the data signal circuit layer 32 is arranged on the main body frame 6 side (that is, the head attaching portion 6b side and the card holding portion 6a side), and the destruction detection circuit layer 34 is arranged on the outer side of the card reader 1. That is, in the board portion 19*p*, the data signal circuit layer 32 is arranged on the upper side, and the destruction detection circuit layer 34 is arranged on the lower side.

In the board portions 19*r*, 19*t*, and 19*v*, and in the connected portion 19*a*, the destruction detection circuit layer 34 is arranged on the main body frame 6 side, and the data signal circuit layer 32 is arranged on the outer side of the card reader 1. That is, in the board portion 19*r*, the destruction detection circuit layer 34 is arranged on the upper side, and the data signal circuit layer 32 is arranged on the lower side. In the board portion 19*t*, the destruction detection circuit layer 34 is arranged on the left side, and the data signal circuit layer 32 is arranged on the right side. In the board portion 19*v* and in the connected portion 19*a*, the destruction detection circuit layer 34 is arranged on the lower side, and the data signal circuit layer 32 is arranged on the upper side.

Configuration of Protection Board

Figure 7:
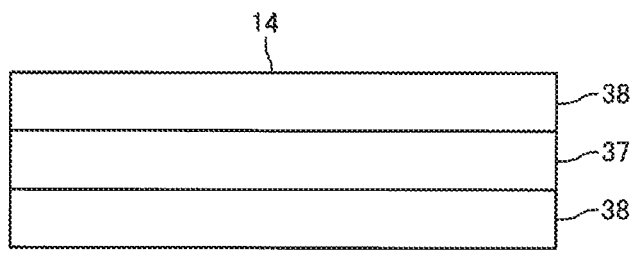
FIG. 7 is a cross-sectional view illustrating a configuration of the protection board illustrated in FIG. 2.

FIG. 7 is a cross-sectional view illustrating a configuration of the protection board 14 illustrated in FIG. 2.

The protection board 14 is a flexible printed circuit board, and formed as a flexible film shape. As illustrated in FIG. 7, the protection board 14 includes a destruction detection circuit layer 37 in which a second destruction detection circuit for detecting its own disconnection or short-circuit is formed, and two insulation layers 38 arranged on both sides of the destruction detection circuit layer 37. The second destruction detection circuit is formed in substantially the entire area of the protection board 14. Destruction detection signals flow in the second destruction detection circuit. Also, the second destruction detection circuit is connected to the battery 25. The insulation layers 38 cover the upper and lower sides of the destruction detection circuit layer 37.

The protection board 14 includes a rear surface portion 14*a* arranged on the rear side of the card reader 1, an upper surface portion 14*b* arranged on the upper side of the card reader 1, a lower surface portion 14*c* arranged on the lower side of the card reader 1, a right surface portion 14*d* arranged on the right side of the card reader 1, a left surface portion 14*e* arranged on the left side of the card reader 1, and a band-shaped connected portion 14*f* connected to the connector 23. The protection board 14 is arranged on the rear side of the flange portion 6*d*.

The protection board 14 is formed by bending a flexible printed circuit board of the predetermined shape, and in which the rear surface portion 14*a*, the upper surface portion 14*b*, the lower surface portion 14*c*, the right surface portion 14*d*, the left surface portion 14*e*, and the connected portion 14*f* are integrated. More specifically, a rear end of the upper surface 14*b* is connected to an upper end of the rear surface portion 14*a*, A lower end of the rear surface portion 14*a* is connected to a rear end of the lower surface portion 14*c*. An upper end of an upper end portion of the right surface portion 14*d* is connected to a right end of the upper surface portion 14*b*. An upper end of an upper end portion of the left surface portion 14*e* is connected to a left end of the upper surface portion 14*b*. A right end of the lower surface portion 14*c* is connected to a lower end of a lower end portion of the right surface portion 14*d*. A lower end of a lower end portion of the left surface portion 14*e* is connected to the left end of the lower surface portion 14*c*. The connected portion 14*f* is connected to a front end of the upper surface portion 14*b*.

The rear surface portion 14*a* is arranged farther toward the rear side than the control board 13 and the card holding portion 6*a*. The upper surface portion 14*b* is arranged farther toward the upper side than the control board 13 and the card holding portion 6*a*. The lower surface portion 14*c* is arranged farther toward the lower side than the control board 13 and the card holding portion 6*a*. The right surface portion 14*d* is arranged farther toward the right side than the control board 13 and the card holding portion 6*a*. The left surface portion 14*e* is arranged farther toward the left side than the control board 13 and the card holding portion 6*a*. That is, the protection board 14 is arranged to surround the card holding portion 6*a* and the control board 13 from upper, lower, left, right and rear sides, and surrounds the card holding portion 6*a* and the control board 13 from upper, lower, left, right, and rear sides.

The lower surface portion 14*c* is arranged below the board portions 19*p* and 19*r* of the FPC 19 and covers, from below, a part of the board portion 19*r* on the rear side of the flange portion 6*d* and the board portion 19*p*. The right surface portion 14*d* is arranged on the right side of the board portion 19*t* of the FPC 19 and covers the board portion 19*t* from the right side. The upper surface portion 14*b* is arranged on the upper side of the board portion 19*v* of the FPC 19 and the connected portion 19*a*, and covers, from above, the board portion 19*v* and the connected portion 19*a*.

As described above, a part of the FPC 19 is covered with the protection board 14. That is, the protection board 14 covers a part of the FPC 19 and protects that part of the FPC 19. In the present embodiment, the rear surface portion 14*a* is the first protection board, the lower surface portion 14*c* is the second protection board, the upper surface portion 14*b* is the third protection board, the right surface portion 14*d* is the fourth protection board, and the left surface portion 14*e* is the fifth protection board.

In the present embodiment, when an area of the FPC 19 covered with the protection board 14 is a protected area PA and an area other than the protected area PA is an unprotected area NPA, the rear side of the flange portion 6*d* is the protected area PA. Also, the front side of flange portion 6*d* is the unprotected area NPA. The magnetic head 7 is arranged in the unprotected area NPA. The control board 13 is arranged in the protected area PA.

As described above, in the board portion 19*p*, the data signal circuit layer 32 is arranged on the main body frame 6 side, and the destruction detection circuit layer 34 is arranged on the outer side of the card reader 1. That is, in the front-end portion of the board portion 19*p* arranged in the unprotected area NPA, the data signal circuit layer 32 is arranged on the main body frame 6 side, and the destruction detection circuit layer 34 is arranged on the outer side of the card reader 1. Also, in the rear end portion of the board portion 19*p* arranged in the protected area PA, the data signal circuit layer 32 is arranged on the main body frame 6 side, and the destruction detection circuit layer 34 is arranged on the outer side of the card reader 1. In the board portions 19*r*, 19*t* and 19*v* and the connected portion 19*a* arranged in the protected area PA, the destruction detection circuit layer 34 is arranged on the main body frame 6 side, and the data signal circuit layer 32 is arranged on the outer side of the card reader 1.

In the present embodiment, at least on the front side of the flange portion 6*d*, the data signal circuit layer 32 is arranged on the main body frame 6 side, and the destruction detection circuit layer 34 is arranged on the outer side of the card reader 1. That is, at least in the unprotected area NPA, the data signal circuit layer 32 is arranged on the main body frame 6 side, and the destruction detection circuit layer 34 is arranged on the outer side of the card reader 1. That is, regarding the FPC 19, at least in the unprotected area NPA, the data signal circuit layer 32 is arranged on the main body frame 6 side, and the destruction detection circuit layer 34 is pulled around on the outer side of the card reader 1.

In the present embodiment, if any kind of malicious acts are performed by malicious users to maliciously acquire data and, disconnection or short-circuit of the second destruction detection circuit of the protection board 14 is detected, disconnection or short-circuit of the destruction detection circuit of the FPC 19 is detected, removal of the card reader 1 from an upper-level device is detected, or removal of the front cover 11 is detected, predetermined processes including deleting data stored in the control board 13, causing the control board 13 to be unusable, and notifying an upper-level device of abnormality, will be performed.

Main Effect of Present Embodiment

As described above, in the present embodiment, the destruction detection circuit layer 34 is formed on one of the sides of the data signal circuit layer 32 in the thickness direction of the FPC 19. Therefore, in the present embodiment, compared to when the destruction detection circuit layer 34 is formed on both sides of the data signal circuit layer 32 in the thickness direction of the FPC 19, a cost and a thickness of the FPC 19 can be reduced.

In the present embodiment, a part of the FPC 19 is covered with the protection board 14 in the protected area PA. Therefore, in the present embodiment, if a malicious user tries to attach a signal line to the data signal circuit of the data signal circuit layer 32 in order to maliciously acquire data in the protected area PA, at least the second destruction detection circuit of the protection board 14 may be disconnected or short-circuited, whereby it can be detected that a malicious act is being performed on the FPC 19.

In the present embodiment, the front-end portion of the board portion 19*p* arranged in the unprotected area NPA is not covered with the protection board 14. However, in the front-end portion of the board portion 19*p* arranged in the unprotected area NPA, the data signal circuit layer 32 is arranged on the main body frame 6 side, and the destruction detection circuit layer 34 is arranged on the outer side of the card reader 1. Therefore, in the present embodiment, if a malicious user tries to attach a signal line to the data signal circuit of the data signal circuit layer 32 in order to maliciously acquire data in the unprotected area NPA, the destruction detection circuit of the destruction detection circuit layer 34 is disconnected or short-circuited, whereby it can be detected that a malicious act is being performed on the FPC 19.

That is, in the present embodiment, if a malicious user tries to attach a signal line to the data signal circuit of the data signal circuit layer 32 in order to maliciously acquire data in both the protected area PA and the unprotected area NPA, it can be detected that a malicious act is being performed on the FPC 19. In the present embodiment, predetermined processes are performed when it is detected that a malicious act is being performed on the FPC 19. This prevents malicious acquisition of magnetic data from the data signal circuit of the data signal circuit layer 32. As described above, in the present embodiment, the cost and the thickness of the FPC 19 can be reduced and, at the same time, malicious acquisition of magnetic data from the data signal circuit of the data signal circuit layer 32 can be avoided.

Also, in the present embodiment, since the thickness of the FPC 19 can be reduced, flexibility of the FPC 19 can be increased. Therefore, in the present embodiment, followability of the magnetic head 7 to the card 2 can be provided even if one end of the FPC 19 is connected to the magnetic head 7.

In the present embodiment, the FPC 19 is formed in a long thin band shape. Therefore, in the present embodiment, compared to when the FPC 19 has a complicated shape with a plurality of bent portions, the number of FPCs 19 to be fabricated can be increased. As a result, in the present embodiment, the cost of the FPC 19 can be further reduced.

In the present embodiment, the FPC 19 is formed in a long thin band shape. In the board portions 19*r*, 19*t*, and 19*v* and the connected portion 19*a* arranged farther toward the other end side of the FPC 19 than the bent portion 19*q*, the destruction detection circuit layer 34 is arranged on the main body frame 6 side, and the data signal circuit layer 32 is arranged on the outer side of the card reader 1.

In the present embodiment, the board portions 19*r*, 19*t*, and 19*v* and the connected portion 19*a* are arranged in the protected area PA on the rear side of the flange portion 6*d*. Therefore, even if the destruction detection circuit layer 34 is arranged on the main body frame 6 side and the data signal circuit layer 32 is arranged on the outer side of the card reader 1 in the board portions 19*r*, 19*t*, and 19*v* and in the connected portion 19*a*, malicious acquisition of magnetic data from the data signal circuit of the data signal circuit layer 32 can be avoided. That is, in the present embodiment, the cost of the FPC 19 is further reduced, and malicious acquisition of magnetic data from the data signal circuit of the data signal circuit layer 32 can be avoided.

Other Embodiments

A desirable embodiment of the invention has been described, but the described embodiment is merely illustrative. Various modifications may be made within the spirit and scope of the invention.

In the above embodiment, the control board 13 may be fixed to the lower surface of the card holding portion 6*a*. In this case, the connecting portion 19*e* of the FPC 19 is formed solely by the board portion 19*p*. The connected portion 19*a* connected to the control board 13 is connected to the rear end of the board portion 19*p*. In this case, in both the unprotected area NPA and the protected area PA, the data signal circuit layer 32 is arranged on the main body frame 6 side, and the destruction detection circuit layer 34 is arranged on the outer side of the card reader 1.

In the above embodiment, in the rear end portion of the board portion 19*p* arranged in the protected area PA, the data signal circuit layer 32 is arranged on the main body frame 6 side, and the destruction detection circuit layer 34 is arranged on the outer side of the card reader 1. However, the data signal circuit layer 32 may be arranged on the main body frame 6 side, and the destruction detection circuit layer 34 may be arranged on the outer side of the card reader 1 in the unprotected area NPA. That is, in the entire FPC 19 arranged in the protected area PA, the destruction detection circuit layer 34 may be arranged on the main body frame 6 side, and the data signal circuit layer 32 may be arranged on the outer side of the card reader 1.

In the above embodiment, the rear surface portion 14*a*, the upper surface portion 14*b*, the lower surface portion 14*c*, the right surface portion 14*d*, and the left surface portion 14*e* are integrated with one another. However, at least one of the rear surface portion 14*a*, the upper surface portion 14*b*, the lower surface portion 14*c*, the right surface portion 14*d*, and the left surface portion 14*e* may be formed separately. In this case, at least one of the rear surface portion 14*a*, the upper surface portion 14b, the lower surface portion 14c, the right surface portion 14d, and the left surface portion 14e may be a flat plate-shaped rigid board. Also, when all the rear surface portion 14a, the upper surface portion 14b, the lower surface portion 14c, the right surface portion 14d, and the left surface portion 14e are formed separately from one another, all the rear surface portion 14a, the upper surface portion 14b, the lower surface portion 14c, the right surface portion 14d, and the left surface portion 14e may be flat plate-shaped rigid boards. Also, in the above embodiment, the protection board 14 does not necessarily have to include the rear surface portion 14a, and does not necessarily have to include the left surface portion 14e.

In the above embodiment, disconnection and short-circuit of the destruction detection circuit are detected using the destruction detection circuit formed in the FPC 19. However, one of disconnection and short-circuit of the destruction detection circuit may be detected using the destruction detection circuit. In the above embodiment, disconnection and short-circuit of the second destruction detection circuit are detected using the second destruction detection circuit formed on the protection board 14. Similarly, however, one of disconnection and short-circuit of the second destruction detection circuit may be detected one of using the second destruction detection circuit formed on the protection board 14.

In the above embodiment, the card reader main body 3 does not necessarily have to include an IC contact block. Also, in the above embodiment, the card reader 1 may be a card transportation-type card reader equipped with a card transport mechanism that automatically transports the card 2. In the above embodiment, the flexible printed circuit board that connects the IC contact block and the control board 13 may be formed in the same manner as in the FPC 19. That is, the flexible printed circuit board that connects the IC contact block and the control board 13 may include the data signal circuit layer 32 and the destruction detection circuit layer 34.

Also, when the flexible printed circuit board that connects the IC contact block and the control board 13 is formed in the same manner as in the FPC 19, and when a part of the flexible printed circuit board is arranged in the unprotected area NPA, the flexible printed circuit board is pulled around along a surface of the main body frame 6 to be parallel to the flexible printed circuit board formed as a thin film and the surface of the main body frame 6, and is pulled around such that the data signal circuit layer 32 is arranged on the main body frame 6 side in at least the unprotected area NPA and the destruction detection circuit layer 34 is arranged on the outer side of the card reader 1. In this case, the card reader main body 3 does not necessarily have to include the magnetic head 7.

Another Embodiment

The above embodiment provides a card reader capable of avoiding a malicious act of maliciously acquiring data from a data signal circuit that transfers signals of data read from a card or signals recorded on a card. Another embodiment here provides a card reader capable of detecting that the card reader is removed from an upper-level device and a malicious user is trying to perform a malicious act to a connecting portion of the protection board and the control board at with a destruction detection circuit is formed, and capable of simplifying configuration compared with the related art.

This another embodiment includes, in the card reader in the above embodiment, a main body frame in which a card moving path along which a card moves is formed, a front cover in which a card insertion opening is formed and which is arranged on the front side of the main body frame, a control board which is a printed circuit board for the control fixed to the main body frame, a detection mechanism to detect that the front cover is removed, and a protection board which is a printed circuit board on which a destruction detection circuit that detects at least one of its own disconnection and short-circuit is formed. When a direction that orthogonally crosses the front-rear direction of the card reader which is the traveling direction of the card moving along the card moving path and the thickness direction of the card moving along the card moving path is a width direction of the card, the protection board includes a plate-shaped or film-shaped first protection board arranged on the rear side of the control board, a plate-shaped or film-shaped second protection board arranged farther toward one side in the thickness direction of the card than the control board, a plate-shaped or film-shaped third protection board arranged farther toward the other side in the thickness direction of the card than the control board, a plate-shaped or film-shaped fourth protection board arranged farther toward one side in the width direction of the card than the control board, and a plate-shaped or film-shaped fifth protection board arranged farther toward the other side in the width direction of the card than the control board. The protection boards are connected to the control board. A connecting portion of each protection board and the control board is arranged on the rear side of the detection mechanism.

In the card reader of this another embodiment, the protection board on which the destruction detection circuit is formed includes the first protection board arranged on the rear side of the control board, the second protection board arranged farther toward one side in the thickness direction of the card than the control board, the third protection board arranged farther toward the other side in the thickness direction of the card than the control board, the fourth protection board arranged farther toward one side in the width direction of the card than the control board, and the fifth protection board arranged farther toward the other side in the width direction of the card than control board. The control board is surrounded by the protection boards from the five directions, that is, the rear side, both sides in the thickness direction of the card, and both sides in the width direction of the card. More specifically, in another embodiment, the connecting portion of the protection board and the control board is surrounded from five directions (the rear side, both sides in the thickness direction of the card, and both sides in the width direction of the card) by the protection board on which the destruction detection circuit is formed. Also, in another embodiment, the connecting portion of the protection board and the control board is arranged on the rear side of the detection mechanism for detecting that the front cover is removed.

Therefore, if a malicious user tries to perform a malicious act on the connecting portion of the protection board and the control board, the destruction detection circuit of the protection board may be disconnected or short-circuited, or the detection mechanism may be destructed. Therefore, in another embodiment, by detecting disconnection and short-circuit of the destruction detection circuit of the protection board or detecting abnormality of the detection mechanism, it can be detected that a malicious user is trying to perform a malicious act on a connecting portion of the protection board and the control board.

In another embodiment, the detection mechanism for detecting that the front cover is removed is used as a means to detect that a malicious user is trying to perform a malicious act on a connecting portion of the protection board and the control board. Therefore, in another embodiment, the protection board may be formed to surround the connecting portion of the protection board and the control board from five directions. That is, in another embodiment, it is not necessary to form the protection board to surround the connecting portion of the protection board and the control board from six directions as in the related art. Therefore, in another embodiment, even if it is possible to detect that a malicious user is trying to perform a malicious act on the connecting portion of the protection board and the control board, the configuration of the card reader can be more simplified than before.

In another embodiment, the protection board is a flexible printed circuit board, and it is desirable that the first protection board, the second protection board, the third protection board, the fourth protection board, and the fifth protection board are desirably integrated with one another. With this configuration, compared to when the first protection board, the second protection board, the third protection board, and the fourth protection board, and the fifth protection board are formed separately from one another, handling of the protection boards becomes easier and, as a result, assembly of the card reader becomes easier.

For example, in another embodiment, a connector to which the protection board is connected is mounted on the control board, for example, and the connector is arranged on the rear side of the detection mechanism. in another embodiment, for example, the detection mechanism is a contact-type detective switch.

In another embodiment, the card reader is desirably equipped with a battery that supplies power to the detection mechanism. With this configuration, the detection mechanism can detect that the front cover is removed even when power of the card reader is turned off.

In another embodiment, the card reader includes a second detection mechanism for detecting that the card reader is removed from an upper-level device on which the card reader has been mounted. The detection mechanism and the second detection mechanism are desirably attached to the front cover. With this configuration, electric wiring of the detection mechanism and electric wiring of the second detection mechanism can be bundled together. Therefore, compared to when the detection mechanism is attached to the main body frame, processing of the electric wiring of the detection mechanism and the second detection mechanism can be simplified. The sheet switch 15 that forms the detection mechanism and the second detection mechanism will be described in detail below.

Configuration of Sheet Switch

Figure 8:
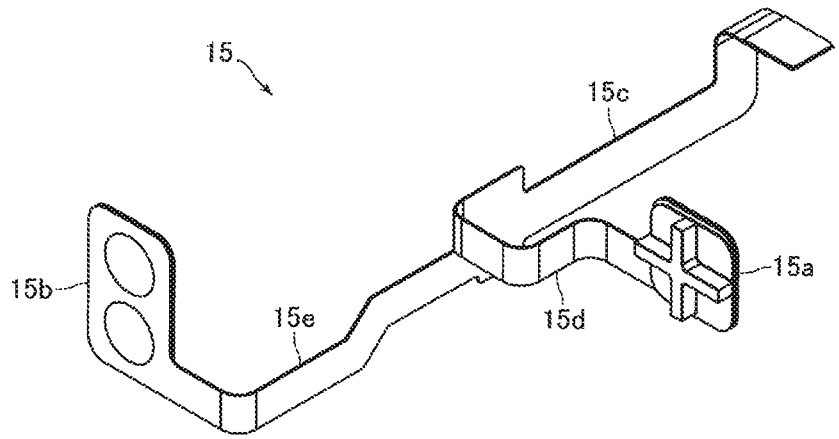
FIG. 8 is a perspective view of a sheet switch illustrated in FIG. 2.

FIG. 8 is a perspective view of sheet switch 15 illustrated in FIG. 2. FIG. 9A illustrates a configuration of a switch portion 15a illustrated in FIG. 8, and FIG. 9B illustrates a configuration of a switch portion 15b illustrated in FIG. 8.

As described above, the sheet switch 15 of the present embodiment is a contact-type detection switch that includes contact electrodes formed as a thin sheet form, and the like. The sheet switch 15 in the present embodiment includes a switch portion 15a which is the detection mechanism for detecting that the front cover 11 is removed, and a switch portion 15b which is the second detection mechanism for detecting that the card reader 1 is removed from an upper-level device.

The switch portion 15a is fixed to an upper end side of the rear surface of the front cover 11. That is, the switch portion 15a is attached to the front cover 11. A protruding portion 6e protruding to the front is formed on the front side of the flange portion 6d of the main body frame 6. When the front cover 11 and the case main body 12 are fixed to each other, as illustrated in FIG. 9A, the contact electrodes of the switch portion 15a are pressed to the front by the protruding portion 6e, causing the switch portion 15a to be conducting. When the front cover 11 is removed, the contact electrodes of the switch portion 15a are not pressed against the protruding portion 6e, causing the switch portion 15a to be non-conducting. Therefore, it is detected that the front cover 11 is removed.

The switch portion 15b is fixed to a bottom surface (a rear surface) of the recessed portion 11d of the front cover 11. That is, the switch portion 15b is attached to the front cover 11. A protruding portion 45 protruding to the rear is formed on the rear side of the front panel of an upper-level device. When the card reader 1 is attached to an upper-level device, as illustrated in FIG. 9B, the contact electrodes of the switch portion 15b are pressed to the rear by the protruding portion 45, causing the switch portion 15b to be conducting. When the card reader 1 is removed from an upper-level device, the contact electrodes of the switch portion 15b are no more pressed by the protruding portion 45, causing the switch portion 15b to be non-conducting. Therefore, it is detected that the card reader 1 is removed from an upper-level device.

One end of the connecting portion 15c is connected to the connector 24. The other end of the connecting portion 15c is branched into a first connecting portion 15d connected to the switch portion 15a, and a second connecting portion 15e connected to the switch portion 15b. The first connecting portion 15d and the second connecting portion 15e are arranged on the front side of the flange portion 6d. The flange portion 6d includes a through hole formed to penetrate the flange portion 6d in the front-rear direction. The sheet switch 15 is pulled around through the through hole.

As described earlier, the connected portion 14f of the protection board 14 is connected to the connector 23 mounted on the control board 13. That is, the protection board 14 is connected to the control board 13 via the connector 23. In the present embodiment, the connector 23 which is the connecting portion of the protection board 14 and the control board 13 is arranged behind the switch portion 15a. That is, the connector 23 is arranged on the rear side of the switch portion 15a. More specifically, the connector 23 is arranged on the rear side of the switch portion 15a via the flange portion 6d. The connector 23 is arranged at substantially the same position as that of the switch portion 15a in the up-down direction and in the left-right direction. That is, the connector 23 is arranged so that at least a part of the connector 23 and a part of the switch portion 15a overlap when seen in the front-rear direction.

As described above, the protection board 14 is arranged to surround the card holding portion 6a and the control board 13 from both the upper and lower sides, both the left and right sides, and the rear side. The connector 23 mounted on the control board 13 is surrounded by the protection board 14 from both the upper and lower sides, both the left and right sides, and the rear side. More specifically, the entire connector 23 mounted on the upper surface of the control board 13 is covered with the protection board 14 from both the left and right sides, the upper side, and the rear side.

In the present embodiment, if any kind of malicious act is performed by a malicious user to acquire data, and disconnection and short-circuit of the destruction detection circuit of the protection board 14 are detected, removal of the card reader 1 from an upper-level device is detected, and, removal of the front cover 11 is detected, predetermined processes including deleting data stored in the control board 13, causing the control board 13 to be unusable, and notifying an upper-level device of abnormality, will be performed. As a result, malicious data acquisition from the control board 13 is avoided.

Main Effects of Another Embodiment

As described above, in another embodiment, the connector 23 which is the connecting portion of the protection board 14 and the control board 13 is surrounded by the protection board 14 from both the upper and lower sides, both the left and right sides, and the rear side. Also, in another embodiment, the connector 23 is arranged on the rear side of the switch portion 15a. Therefore, in another embodiment, if a malicious user tries to perform a malicious act on the connecting portion of the protection board 14 and the control board 13, the destruction detection circuit of the protection board 14 is disconnected or short-circuited, or the switch portion 15a is destructed. Therefore, in another embodiment, by detecting disconnection and short-circuit of the destruction detection circuit of the protection board 14 or detecting abnormality of the switch portion 15a, it can be detected that a malicious user is trying to perform a malicious act on a connecting portion of the protection board 14 and the control board 13.

In another embodiment, the switch portion 15a for detecting that the front cover 11 is removed is used as a means to detect that a malicious user is trying to perform a malicious act on a connecting portion of the protection board 14 and the control board 13. Therefore, in another embodiment, the protection board 14 may be formed to surround the connecting portion of the protection board 14 and the control board 13 from five directions of both the upper and lower sides, both the left and right sides, and the rear side. That is, in another embodiment, it is not necessary to form the protection board 14 to surround the connecting portion of the protection board 14 and the control board 13 from six directions as in the related art.

In another embodiment, the protection board 14 is a flexible printed circuit board, of which rear surface portion 14a, upper surface portion 14b, lower surface portion 14c, right surface portion 14d, and left surface portion 14e are integrated with one another. Therefore, in another embodiment, compared with a case when the rear surface portion 14a, the upper surface portion 14b, the lower surface portion 14c, the right surface portion 14d, and the left surface portion 14e are formed separately from one another, handling of the protection board 14 becomes easier and, as a result, assembly of the card reader 1 becomes easier.

In another embodiment, electric power is supplied to the sheet switch 15 from the battery 25 mounted on the control board 13. Therefore, in another embodiment, even when the power of the card reader 1 is turned off, removal of the front cover 11 and removal of the card reader 1 from an upper-level device can be detected.

In another embodiment, the switch portion 15a for detecting that the front cover 11 is removed, and the switch portion 15b for detecting that the card reader 1 is removed from an upper-level device are attached to the front cover 11. Therefore, in another embodiment, electric wiring of the switch portion 15a and electric wiring of the switch portion 15b can be bundled together using the common connecting portion 15c. Therefore, in another embodiment, handling of electric wiring of the switch portions 15a and 15b can be simplified.

Other Variations

In the above embodiments, the connected portion 14f of the protection board 14 may be soldered to the control board 13. That is, the protection board 14 may be directly connected to the control board 13. In this case, the connecting portion of the protection board 14 and the control board 13 is arranged on the rear side of the switch portion 15a. The connecting portion of protection board 14 and the control board 13 is surrounded by the protection board 14 from both the upper and lower sides, both the left and right sides, and the rear side.

In the above embodiment, the sheet switch that includes the switch portion 15a and the sheet switch that includes the switch portion 15b may be provided separately. Also, in the above embodiment, the switch portion 15a may be attached to the flange portion 6d. That is, the switch portion 15a may be attached to the main body frame 6. In the above embodiment, the switch portion 15a which is a contact-type detection switch having contact electrodes is used as a detection mechanism for detecting detect that the front cover 11 is removed. The detection mechanism may be a mechanical switch other than the contact-type detection switch or may be an optical sensor.

In the above embodiment, disconnection and short-circuit of the destruction detection circuit are detected using the destruction detection circuit formed on the protection board 14. However, one of disconnection and short-circuit of the destruction detection circuit may be detected using the destruction detection circuit formed on the protection board 14. In the above embodiment, the card reader main body 3 does not necessarily have to include the magnetic head 7 or does not necessarily have to include the IC contact block. In the above embodiment, the card reader 1 is a manual card reader. However, the card reader 1 may be a card transportation-type card reader equipped with a card transport mechanism that automatically transports the card 2.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A card reader that performs at least one of reading data recorded on a card and recording data on a card, the card reader comprising:
   a main body frame comprising a card moving path along which the card moves;
   a flexible printed circuit board pulled around along the main body frame; and
   a protection board that is a printed circuit board configured to protect a part of the flexible printed circuit board, wherein
   the flexible printed circuit board comprises:
      a data signal circuit layer comprising a data signal circuit configured to transfer at least one of signals of data read from the card and signals of data recorded on the card, and
      a destruction detection circuit layer comprising a destruction detection circuit configured to detect at least one of its own disconnection and short-circuit, wherein the destruction detection circuit layer overlaps the data signal circuit layer, a second destruction detection circuit configured to detect at least one of its own disconnection and short-circuit is provided on the protection board, the destruction detection circuit layer is provided on one side of the data signal circuit layer in a thickness direction of the flexible printed circuit board, a part of the flexible printed circuit board is covered with the protection board, when an area of the flexible printed circuit board covered with the protection board is a protected area and an area other than the protected area is an unprotected area, the flexible printed circuit board is pulled around so that the data signal circuit layer is arranged on the main body frame side at least in the unprotected area and the destruction detection circuit layer is arranged on an outer side of the card reader.

2. The card reader according to claim 1, further comprising:

a magnetic head structured to perform at least one of reading magnetic data recorded on the card and recording magnetic data on the card; and a control board which is a printed circuit board for control, wherein when an insertion direction side of the card into the card reader is a rear side and a removal direction side of the card from the card reader is a front side, the main body frame comprises a card holding portion that holds a rear end portion of the card inserted into the card reader, and a head attaching portion arranged on the front side of the card holding portion and in which the magnetic head is arranged, one end of the flexible printed circuit board is connected to the magnetic head, and the other end of the flexible printed circuit board is connected to the control board, the magnetic head is arranged in the unprotected area, and the control board is fixed to the card holding portion and is arranged in the protected area.

3. The card reader according to claim 2, wherein the main body frame comprises a flange portion extending in a flange shape from a front end of the card holding portion, the head attaching portion protrudes to the front from the flange portion, the protected area is located on the rear side of the flange portion, the data signal circuit layer is arranged on the main body frame side at least on the front side of the flange portion, and the destruction detection circuit layer is arranged on the outer side of the card reader.

4. The card reader according to claim 3, wherein when one side in the thickness direction of the card moving along the card moving path is a first direction side, a side opposite to the first direction side is a second direction side, one side in the width direction of the card orthogonally crossing the thickness direction and the front-rear direction of the card is a third direction side, and a side opposite to the third direction side is a fourth direction side, the magnetic head is arranged so that a magnetic gap of the magnetic head faces the card moving path from the first direction side, the one end of the flexible printed circuit board is connected to the first direction end side of the magnetic head, the control board is fixed to the surface of the second direction side of the card holding portion, the flexible printed circuit board is formed in a long thin shape having a first board portion extending to the rear side from the magnetic head along a surface of the first direction side of the head attaching portion and a surface of the first direction side of the card holding portion, a first bent portion bent 90 degrees on the third direction side at a rear end of the first board portion, a second board portion extending on the third direction side from the first bent portion, a second bent portion bent 90 degrees on the second direction side at the third direction end of the second board portion, a third board portion extending on the second direction side from the second bent portion, a third bent portion bent 90 degrees on the fourth direction side at the second direction edge of the third board portion, and a fourth board portion extending on the fourth direction side from the third bent portion and is connected to the control board, the first bent portion, the second board portion, the second bent portion, the third board portion, the third bent portion and the fourth board portion are arranged on the rear side of the flange portion, in the first board portion, the data signal circuit layer is arranged on the body frame side, and the destruction detection circuit layer is arranged on the outer side of the card reader, and in the second board portion, the third board portion and the fourth board portion, the destruction detection circuit layer is arranged on the main body frame side, and the data signal circuit layer is arranged on the outer side of the card reader.

5. The card reader according to claim 4, wherein the protection board comprises a first protection board, a second protection board, a third protection board, a fourth protection board, and a fifth protection board which are plate-shaped or film-shaped, the first protection board is arranged on the rear side of the card holding portion, the second protection board is arranged farther toward the first direction side than the first board portion and the second board portion, the third protection board is arranged farther toward the second direction side than the fourth board portion, the fourth protection board is arranged farther toward the third direction side than the third board portion, and the fifth protection board is arranged farther toward the fourth direction side than the card holding portion.

* * * * *